(12) United States Patent
Wu et al.

(10) Patent No.: US 9,313,924 B2
(45) Date of Patent: Apr. 12, 2016

(54) HEAT SINKING PAD AND PRINTED CIRCUIT BOARD

(71) Applicant: BOE TECHNOLOGY GROUP CO., LTD., Beijing (CN)

(72) Inventors: Yue Wu, Beijing (CN); Hongjun Xie, Beijing (CN); Yan Ren, Beijing (CN); Zifeng Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/442,171

(22) PCT Filed: Sep. 26, 2014

(86) PCT No.: PCT/CN2014/087527
§ 371 (c)(1),
(2) Date: May 12, 2015

(87) PCT Pub. No.: WO2015/176456
PCT Pub. Date: Nov. 26, 2015

(65) Prior Publication Data
US 2015/0351284 A1 Dec. 3, 2015

(30) Foreign Application Priority Data

May 19, 2014 (CN) .......................... 2014 2 0256932

(51) Int. Cl.
*H05K 1/00* (2006.01)
*H05K 7/20* (2006.01)
*H05K 1/02* (2006.01)

(52) U.S. Cl.
CPC .......... *H05K 7/20509* (2013.01); *H05K 1/0203* (2013.01)

(58) Field of Classification Search
CPC ............. H05K 1/02; H05K 1/11; H05K 3/34; H01L 21/02; H01L 21/58; H01L 21/60; H01L 23/28; H01L 23/31; H01L 23/34; H01L 23/36; H01L 23/42; H01L 23/48; H01L 23/60; H01L 23/373; H01L 23/433
USPC ............. 174/252, 260; 361/704, 719; 29/825, 29/840; 257/685, 713
See application file for complete search history.

(56) References Cited

U.S. PATENT DOCUMENTS 4,034,468 A * 7/1977 Koopman ........... H01L 23/3736
174/16.3
5,088,007 A * 2/1992 Missele .............. B23K 35/0222
165/185

(Continued)

FOREIGN PATENT DOCUMENTS

CN 1443035 A 9/2003
CN 201869440 U 6/2011

(Continued)

OTHER PUBLICATIONS

International Search Report dated Sep. 26, 2014 corresponding to International application No. PCT/CN2014/087527.
Written Opinion of the International Searching Authority dated Dec. 31, 2014 corresponding to International application No. PCT/CN2014/087527.

*Primary Examiner* — Xiaoliang Chen
(74) *Attorney, Agent, or Firm* — Nath, Goldberg & Meyer; Joshua B. Goldberg

(57) ABSTRACT

The present invention relates to a heat sinking pad and a printed circuit board. The surface of the heat sinking pad on which electronic components are placed comprises a solder loading area and a solder non-loading area, wherein the solder loading area is used for being coated with solder; and the solder non-loading area comprises heat collection passages for collecting heat on the heat sinking pad and heat dissipation passages communicated with the heat collection passages. Openings of the heat dissipation passages are positioned at edges of the heat sinking pad so as to discharge the heat collected by the heat collection passages to the outside of the heat sinking pad. The heat dissipation to the edges of the heat sinking pad along the heat collection passages and the heat dissipation passages is faster than along the solder loading area, so the heat sinking pad has higher heat dissipation speed.

20 Claims, 4 Drawing Sheets

(56) References Cited

U.S. PATENT DOCUMENTS

| | | | | |
|---|---|---|---|---|
| 5,410,449 A | * | 4/1995 | Brunner | H01L 23/49838 174/252 |
| 6,281,844 B1 | * | 8/2001 | Kodim | H01Q 9/0407 343/700 MS |
| 2005/0284918 A1 | * | 12/2005 | Martin | B23K 35/0244 228/180.22 |
| 2011/0267930 A1 | * | 11/2011 | Hurley | G11B 5/105 369/13.32 |

FOREIGN PATENT DOCUMENTS

| | | |
|---|---|---|
| CN | 202285232 U | 6/2012 |
| CN | 102543765 A | 7/2012 |
| JP | 06104558 A | 4/1994 |

* cited by examiner

HEAT SINKING PAD AND PRINTED CIRCUIT BOARD

This is a National Phase Application filed under 35 U.S.C. 371 as a national stage of PCT/CN2014/087527, filed Sep. 26, 2014, an application claiming the benefit of Chinese Application No. 201420256932.8, filed May 19, 2014, the content of each of which is hereby incorporated by reference in its entirety.

FIELD OF THE INVENTION

The present invention relates to the field of package technology of printed circuit boards, and in particular, relates to a heat sinking pad and a printed circuit board.

BACKGROUND OF THE INVENTION

With continuous development of electronic design technology, the miniaturization level of electronic components and the integration level of integrated circuits are increasingly improved. Thus, heat flux density of the electronic components and assemblies is increased, which puts forwards a higher requirement for heat dissipation of the electronic components, and in turn a heat sinking pad arranged on the printed circuit board (hereinafter referred to as PCB) is required to have higher heat dissipation efficiency.

FIG. 1 is a structural schematic diagram of an existing PCB substrate. As shown in FIG. 1, a heat sinking pad 1 is arranged on the PCB substrate. A cross-shaped green oil solder mask 2 is arranged on the heat sinking pad 1, and divides the heat sinking pad into four soldering areas. The four soldering areas serve as tinning areas, and are coated with tin paste on the surfaces thereof. The heat sinking pad 1 is provided with a plurality of heat dissipation holes (not shown in the figure) at the areas underneath the green oil solder mask 2, for dissipating heat produced by electronic components on the heat sinking pad 1.

In the above heat sinking pad, the heat dissipation holes are formed at the areas underneath the green oil solder mask without being provided below the tinning areas, in order to prevent the tin paste from leaking through the heat dissipation holes. Thus, the heat produced by the electronic components soldered on the heat sinking pad 1 during working cannot be directly dissipated into the heat dissipation holes and discharged through the walls of the heat dissipation holes, so that the heat dissipation of the heat sinking pad is relatively slow and the heat dissipation efficiency is relatively low.

SUMMARY OF THE INVENTION

The present invention aims to at least solve one of the technical problems in the prior art. Thus, a heat sinking pad and a printed circuit board are provided, for quickly dissipating heat through heat collection passages and heat dissipation passages which are relatively low in temperature, so as to achieve relatively high heat dissipation speed.

A heat sinking pad is provided for achieving the objective of the present invention. A surface of the heat sinking pad on which electronic components are placed includes a solder loading area and a solder non-loading area, wherein the solder loading area is used for being coated with solder; and the solder non-loading area includes heat collection passages for collecting heat on the heat sinking pad and heat dissipation passages communicated with the heat collection passages, openings of the heat dissipation passages are positioned at edges of the heat sinking pad so as to discharge the heat collected by the heat collection passages to the outside of the heat sinking pad.

Preferably, the heat collection passages include a first heat collection passage which is in a shape of a closed ring.

Preferably, the heat collection passages further include one or more second heat collection passages, each of which includes a plurality of heat collection sections arranged in a ring shape, each heat collection section being communicated with at least one heat dissipation passage.

Preferably, the first heat collection passage is in a shape of a closed rectangular ring, and the plurality of heat collection sections included in each second heat collection passage are arranged in a shape of a rectangular ring.

Preferably, the heat sinking pad is provided with a plurality of sides, an edge of each side corresponding to at least one heat dissipation passage, the heat dissipation passage extending from inside of the heat sinking pad to the edge of the corresponding side.

Preferably, the heat sinking pad is provided with a plurality of heat dissipation holes which are uniformly distributed in the heat sinking pad at positions corresponding to the solder loading area.

Preferably, the heat dissipation holes are semi-stop holes.

As another technical solution, the present invention further provides a printed circuit board on which a heat sinking pad is arranged, and the heat sinking pad is the above one provided by the present invention.

The present invention has the following beneficial effects:

The heat collection passages and the heat dissipation passages are formed on the surface of the heat sinking pad provided by the present invention and both are positioned in the solder non-loading area. Electronic components soldered on the soldering pad may produce heat during working, and the heat may be transferred to solder, so the temperature of the heat collection passages and the heat dissipation passages is lower than that of the solder loading area and the solder coated on the solder loading area. Thus, most of the heat transferred to the solder is dissipated into the heat collection passages and then dissipated to the outside of the heat sinking pad through the heat dissipation passages communicated with the heat collection passages. The heat dissipation to the edge of the heat sinking pad along the heat collection passages and the heat dissipation passages is faster than along the solder loading area, so the heat sinking pad provided by the present invention has higher heat dissipation speed.

The printed circuit board provided by the present invention adopts the above heat sinking pad provided by the present invention, wherein most of the heat produced and transferred to the solder from electronic components soldered on the heat sinking pad is dissipated into the heat collection passages and then dissipated to the outside of the heat sinking pad through the heat dissipation passages communicated with the heat collection passages. The heat dissipation to the edges of the heat sinking pad along the heat collection passages and the heat dissipation passages is faster than along the solder loading area, so the printed circuit board provided by the present invention has higher heat dissipation speed.

BRIEF DESCRIPTION OF THE DRAWINGS

The accompanying drawings constituting a part of the specification are used for providing further understanding of the present invention, and are used for explaining the present invention with specific embodiments below, rather than limiting the present invention. In which.

REFERENCE NUMERALS

1: heat sinking pad; 2, green oil solder mask;
10: heat sinking pad; 20: printed circuit board;
11: solder loading area; 12: solder non-loading area;
13: heat dissipation hole; 120: heat collection passage;
121: heat dissipation passage; 120a: first heat dissipation passage;
120b: second heat dissipation passage;
H, L, M, N and P: a plurality of areas forming the solder loading area 11.

DETAILED DESCRIPTION OF THE EMBODIMENTS

The specific embodiments of the present invention will be described in detail below in combination with the accompanying drawings. It should be understood that, the specific embodiments described herein are merely used for describing and interpreting the present invention, rather than limiting the present invention.

Figure 1:
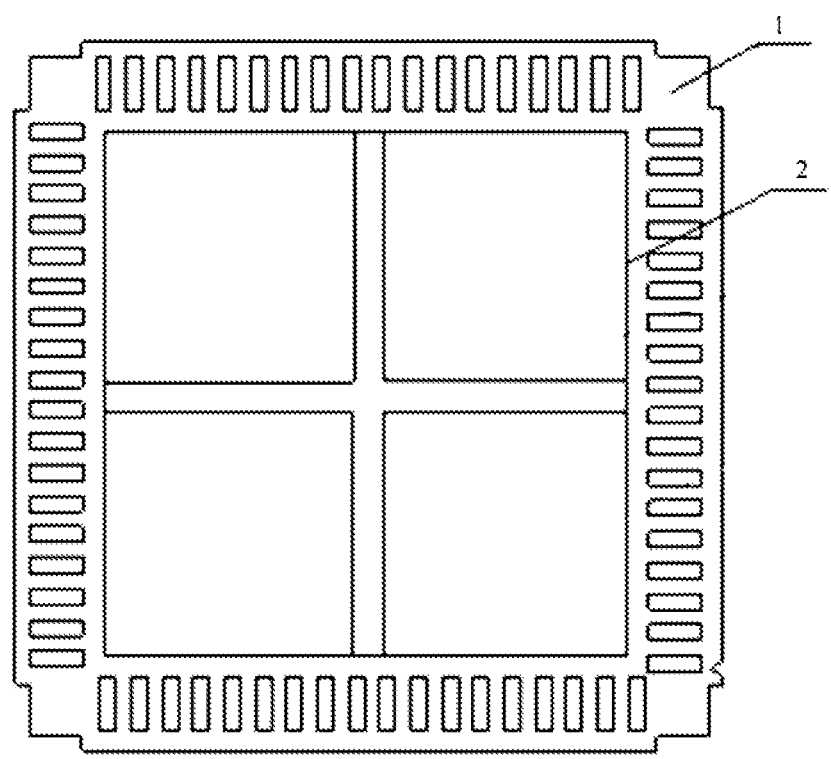
FIG. 1 is a structural schematic diagram of a PCB substrate in the related art.
Figure 2:
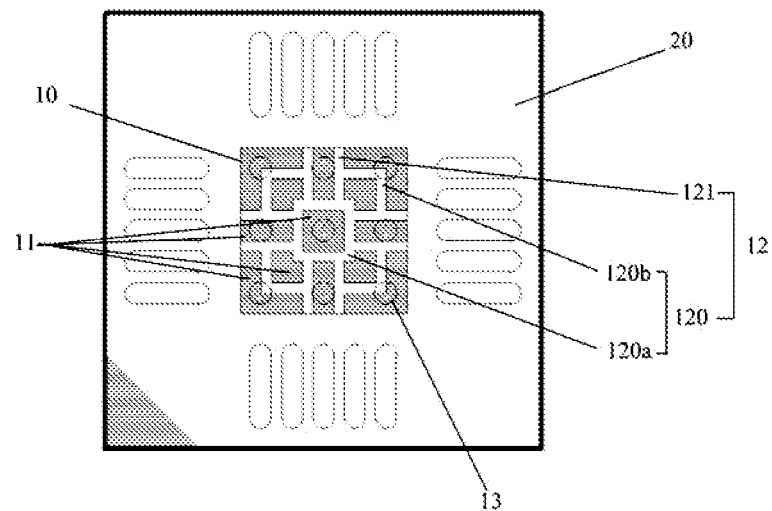
FIG. 2 is a schematic diagram of a printed circuit board with a heat sinking pad provided by an embodiment of the present invention.

Please see FIG. 2, which is a schematic diagram of a printed circuit board with a heat sinking pad provided by an embodiment of the present invention. A heat sinking pad 10 is arranged on a printed circuit board 20, and the surface of the heat sinking pad 10 used for placing electronic components includes a solder loading area 11 and a solder non-loading area 12, wherein the solder loading area 11 is used for being coated with solder. In this embodiment, the solder is tin paste. The solder non-loading area 12 includes heat collection passages 120 and heat dissipation passages 121. Specifically, the heat collection passages 120 are used for collecting heat of the heat sinking pad 10, which is generally produced by the electronic components soldered on the surface of the heat sinking pad 10 during working, and is transferred to the tin paste coated on the surface of the heat sinking pad 10 through heat conduction. The heat dissipation passages 121 are communicated with the heat collection passages 120, and openings of the heat dissipation passages 121 are positioned at the edges of the heat sinking pad 10 so as to discharge the heat collected by the heat collection passages 120 to the outside of the heat sinking pad 10.

Specifically, in this embodiment, the heat collection passages 120 include a first heat collection passage 120a which may be in the shape of a closed ring. In practical application, the heat produced by the electronic components soldered on the heat sinking pad 10 during working is transferred to the tin paste coated on the solder loading area 11, so that the temperature of the tin paste and the solder loading area 11 rises; meanwhile, the heat is also transferred from the solder loading area 11 to the solder non-loading area 12, so that the temperature of the solder non-loading area 12 rises. It is easily understood that, in this process, the temperature of the solder non-loading area 12 is lower than that of the surrounding tin paste and the solder loading area 11. Moreover, the contact area between the edge of the heat sinking pad 10 and the outside and the contact area between the tin paste at the edge and the outside are relatively large, and the speed of heat dissipation thereof is higher than that of heat dissipation of the center zone of the heat sinking pad 10 and the tin paste in the center zone, so the temperature of the center zone of the heat sinking pad 10 and the tin paste in the center zone is higher than that of the edge of the heat sinking pad 10 and the tin paste at the edge.

In this embodiment, the heat of the tin paste in the center zone of the heat sinking pad 10 and the solder loading area 11 is uniformly radiated outwardly, and the heat may be radiated to the first heat collection passage 120a. In addition, because the temperature of the first heat collection passage 120a is lower than that of the solder loading area 11 and the tin paste in the adjacent area of the first heat collection passage 120a, according to the heat radiation principle, most of the heat in the first heat collection passage 120a may not be continuously radiated outwards along the tin paste and the solder loading area 11 in the adjacent area but may be transferred to the heat dissipation passages 121 along the first heat collection passage 120a and dissipated to the outside of the heat sinking pad 10 through the heat dissipation passages 121. The heat dissipation speed is faster than that along the surrounding tin paste and the solder loading area 11.

Preferably, the first heat collection passage 120a is in the shape of a closed ring, and more preferably, in the shape of a closed rectangular ring (as shown in FIG. 2).

In addition, besides the first heat collection passage 120a, the heat collection passages may further include a second heat collection passage 120b. The second heat collection passage 120b includes a plurality of heat collection sections which are arranged in a ring shape, each heat collection section being communicated with at least one heat dissipation passage 121. Preferably, the plurality of heat collection sections are arranged in the shape of a rectangular ring.

Preferably, in this embodiment, there is one first heat collection passage 120a and one second heat collection passage 120b, and the first heat collection passage 120a is positioned on the inner side of the heat sinking pad 10 in relation to the second heat collection passage 120b. It should be noted that, the number of the second heat collection passage is not limited in the present invention, and may be one or more.

In this embodiment, the tin paste in the area between the first heat collection passage 120a and the second heat collection passage 120b may also radiate heat into the first heat collection passage 120a with relatively low temperature, and this part of heat is also quickly dissipated to the outside of the heat sinking pad 10 through the first heat collection passage 120a and the heat dissipation passages 121.

Similarly, the tin paste in the area between the first heat collection passage 120a and the second heat collection passage 120b may radiate heat outwardly into the second heat collection passage 120b, and the tin paste outside the second heat collection passage 120b may also radiate heat into the second heat collection passage 120b. The above-mentioned heat may be transferred into the heat dissipation passages 121 along the second heat collection passage 120b and then quickly dissipated to the outside of the heat sinking pad 10 through the heat dissipation passages 121.

Moreover, in this embodiment, the outer contour of the heat sinking pad 10 is provided with a plurality of sides. The edge of each side corresponds to at least one heat dissipation passage 121. That is to say, each heat dissipation passage 121 extends from the inside of the heat sinking pad 10 to the edge of the corresponding side. Specifically, for example, in the embodiment shown in FIG. 4, under the condition that the heat sinking pad 10 is square, the edges of the heat sinking pad 10 are formed by four edges corresponding to four sides of a rectangle, and the edge of each side corresponds to two heat dissipation passages 121.

In different embodiments of the present invention, the number, shape and position of the first heat collection passage 120a and the second heat collection passage 120b may be set according to the heat dissipation need of the heat sinking pad 10, so that the heat of the solder loading area 11 of the heat sinking pad 10 may be quickly transferred into the first heat collection passage 120a and/or the second heat collection passage 120b, and then the heat sinking pad 10 has higher heat dissipation speed.

The heat collection passages 120 and the heat dissipation passages 121 are formed on the surface of the heat sinking pad 10 provided by this embodiment and both are positioned in the solder non-loading area 12. Thus, when electronic components soldered on the soldering pad 10 work, the temperature of the heat collection passages 120 and the heat dissipation passages 121 may be lower than that of the solder loading area 11 and the solder coated on the solder loading area 11, so that most of the heat produced by the electronic components soldered on the soldering pad 10 and transferred to the solder is dissipated into the heat collection passages 120 and then to the outside of the heat sinking pad 10 through the heat dissipation passages 121 which are communicated with the heat collection passages 120. Obviously, the heat dissipation to the edge of each side of the heat sinking pad 10 along the heat collection passages 120 and the heat dissipation passages 121 is faster than along the solder loading area 11, so the heat sinking pad 10 provided by this embodiment has higher heat dissipation speed.

In this embodiment, the area inside the first heat collection passage 120a, the area between the first heat collection passage 120a and the second heat collection passage 120b and the area (which does not include the area occupied by the heat dissipation passages 121) outside the second heat collection passage 120b are the solder loading area 11, the surface of which is coated with tin paste. In this way, the soldering area between the heat sinking pad 10 and the electronic components may be larger. In addition, the electronic components are substantially uniformly distributed at a plurality of soldering positions on the solder loading area 11 of the heat sinking pad 10, so that the soldering stability may be improved.

Figure 3:
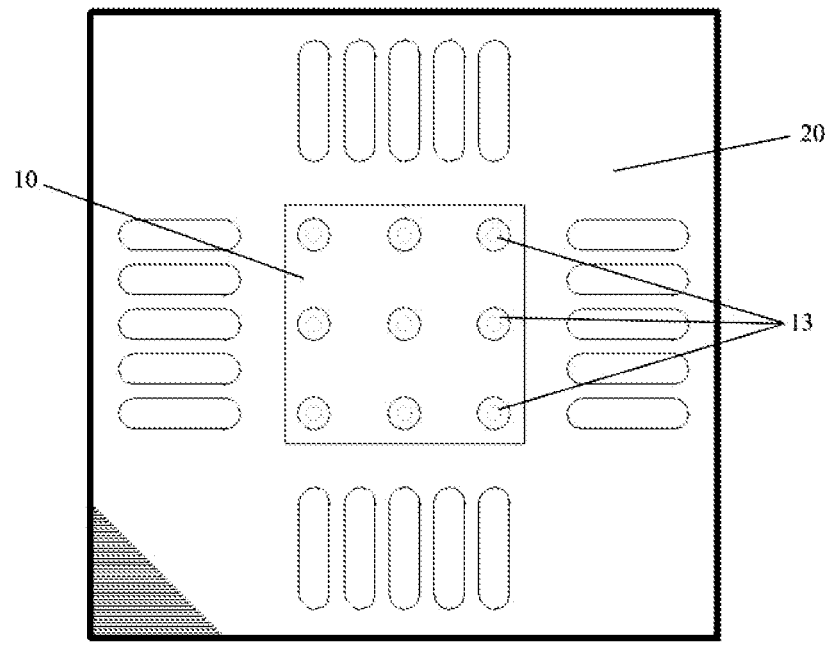
FIG. 3 is a schematic diagram of distribution of heat dissipation holes in the heat sinking pad shown in FIG. 2.

In this embodiment, as shown in FIG. 3, the heat sinking pad 10 is provided with a plurality of heat dissipation holes 13 which are uniformly distributed in the heat sinking pad 10 and formed on the solder loading area 11. Due to the heat dissipation holes 13, the heat of the solder loading area 11 and the solder coated on the solder loading area 11 may also be transferred to the outside of the heat sinking pad 10 through the heat dissipation holes 13. Moreover, since the heat dissipation holes 13 are formed in correspondence to the solder loading area 11, the heat on the solder loading area 11 and the solder may be effectively and quickly dissipated through the heat dissipation holes 13. In practical application, the heat dissipation holes 13 may be distributed according to the distribution of the solder loading area 11 on the heat sinking pad 10 and the requirement of heat dissipation on the solder. In this embodiment, the distribution of the plurality of heat dissipation holes 13 is as shown in FIG. 3.

In this embodiment, the heat dissipation holes 13 are preferably semi-stop holes, so as to prevent the solder such as tin paste coated on the solder loading area 11 from being infiltrated into the printed circuit board 20 via the heat dissipation holes 13.

Figure 4:
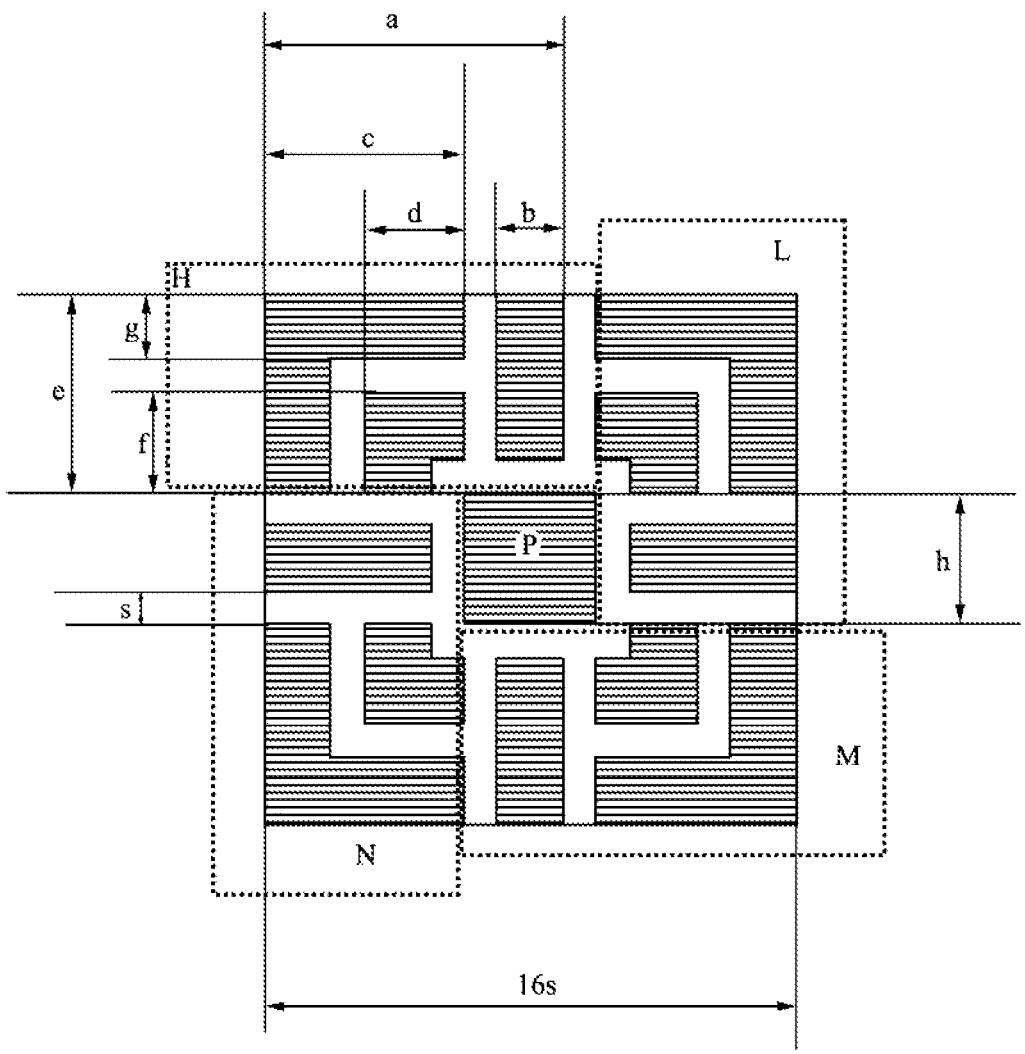
FIG. 4 is a detailed schematic diagram of the heat sinking pad provided by the embodiment of the present invention.

Preferably, the first heat collection passage 120a is in the shape of a closed rectangular ring; the plurality of heat collection sections included in the second heat collection passage 120b are arranged in the shape of a rectangular ring; and each of the plurality of heat dissipation passages 121 extends from the first heat collection passage 120a to the edge of each side of the heat sinking pad 10, so that the shape of the heat sinking pad 10 is as shown in FIG. 4. In FIG. 4, the whole heat sinking pad 10 may be divided into four areas H, L, M and N, which are identical in pattern and size, as well as an area P positioned inside the first heat collection passage 120a. Under such a condition, the following parameters are taken as an example: the heat sinking pad 10 is square, and has side lengths of 16 s; the widths of the first heat collection passage 120a, the second heat collection passage 120b and each heat dissipation passage 121 are s; a=9 s; b=2 s; c=6 s; d=3 s; e=6 s; f=3 s; g=2 s and h=4 s.

The area of the solder loading area 11 in the area H is $S_H = 2$ s×5 s+3 s×3 s−s×s+2 s×4 s+2 s×6 s=38 $s^2$;

the area of the solder loading area 11 in the area P is $S_P = 4$ s×4 s=16 $s^2$, the area of the surface of the heat sinking pad 10 is $S_{10} = 16$ s×16 s=256 $s^2$;

thus, the area ratio of the solder loading area 11 to the heat sinking pad 10 is $(S_H + S_L + S_M + S_N + S_P)/S10 = (4 \times 38\ s^2 + 16\ s^2)/256\ s^2 = 168\ s^2/256\ s^2 = 0.65625 \approx 66\%$.

According to the above description, under the condition that the heat sinking pad 10 is set to be the pattern shown in FIG. 4 and the above parameters are adopted, the area ratio of the solder loading area 11 to the heat sinking pad 10 is more than 60% (approximate to 66%), which indicates that the area ratio of the solder loading area 11 to the surface of the heat sinking pad 10 is relatively large, so that the soldering between electronic components and the heat sinking pad 10 is very stable.

It should be noted that, in this embodiment, the heat collection passages 120 preferably include one first heat collection passage 120a and one second heat collection passage 120b, but the present invention is not limited thereto. In practical application, the number of each of the first heat collection passage 120a and the second heat collection passage 120b is not limited to this. In addition, the heat collection passages 120 may also merely include the first heat collection passage 120a or the second heat collection passage 120b. Under the condition that the heat collection passages 120 merely include second heat collection passages 120b, a plurality of second heat collection passages 120b may be constructed to surround each other, namely the second heat collection passage 120b with larger contour surrounds the outside of the second heat collection passage 120b with smaller contour.

It also should be noted that, in this embodiment, the first heat collection passage 120a is in the shape of the closed rectangular ring, and the plurality of heat collection sections forming the second heat collection passage 120b are arranged in the shape of a rectangular ring, but the present invention is not limited thereto. In practical application, the shapes of the first heat collection passage 120a and the second heat collection passage 120b may be set according to the heat dissipation requirement of the heat sinking pad 10 and the area ratio of the solder loading area 11 to the heat sinking pad 10. Specifically, for example, the first heat collection passage 120a may also be circular, elliptical or in other irregular ring shape. Similarly, the plurality of heat collection sections may also be arranged in the shape of a circle, an ellipse or other irregular ring.

Figure 5:
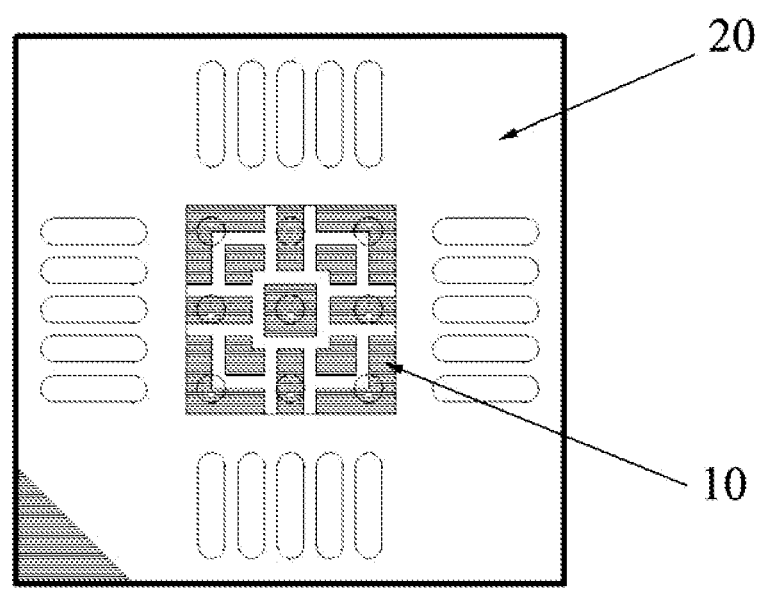
FIG. 5 is a schematic diagram of a printed circuit board provided by an embodiment of the present invention.

As another aspect of the present invention, an embodiment of the present invention further provides a printed circuit board. FIG. 5 is a schematic diagram of a printed circuit board provided by the embodiment of the present invention. As shown in FIG. 5, a heat sinking pad 10 is arranged on the printed circuit board 20, and the heat sinking pad adopts the heat sinking pad 10 provided by the above embodiment of the present invention.

The printed circuit board 20 provided by the embodiment of the present invention adopts the heat sinking pad 10 provided by the above embodiment of the present invention, and most of the heat produced by the electronic components soldered on the heat sinking pad 10 and transferred to the solder is dissipated into the heat collection passages and then to the outside of the heat sinking pad through the heat dissipation passages which are communicated with the heat collection passages. The heat dissipation to the edge of the heat sinking pad along the heat collection passages and the heat dissipation passages is faster than along the solder loading area, so the printed circuit board provided by this embodiment has higher heat dissipation speed.

It could be understood that, the above embodiments are merely exemplary embodiments adopted for illustrating the principle of the present invention, however, the present invention is not limited thereto. Various variations and improvements may be made for those of ordinary skill in the art without departing from the spirit and essence of the present invention, and these variations and improvements are contemplated as within the protection scope of the present invention.

The invention claimed is:

1. A heat sinking pad, a surface of the heat sinking pad on which electronic components are placed comprising a solder loading area used for being coated with solder and a solder non-loading area, wherein
the solder non-loading area comprises heat collection passages for collecting heat on the heat sinking pad and heat dissipation passages communicated with the heat collection passages, and openings of the heat dissipation passages are positioned at edges of the heat sinking pad so as to discharge the heat collected by the heat collection passages to outside of the heat sinking pad.

2. The heat sinking pad of claim 1, wherein the heat collection passages comprise a first heat collection passage which is in a shape of a closed ring.

3. The heat sinking pad of claim 2, wherein the heat collection passages further comprise one or more second heat collection passages, each of which comprises a plurality of heat collection sections arranged in a ring shape, and each heat collection section being communicated with at least one of the heat dissipation passages.

4. The heat sinking pad of claim 3, wherein the first heat collection passage is in a shape of a closed rectangular ring, and the plurality of heat collection sections comprised in each of the second heat collection passages are arranged in a shape of a rectangular ring.

5. The heat sinking pad of claim 1, wherein the heat sinking pad is provided with a plurality of sides, the edge of each side corresponding to at least one heat dissipation passage, and the heat dissipation passage extending from inside of the heat sinking pad to the edge of the corresponding side.

6. The heat sinking pad of claim 2, wherein the heat sinking pad is provided with a plurality of sides, the edge of each side corresponding to at least one heat dissipation passage, and the heat dissipation passage extending from inside of the heat sinking pad to the edge of the corresponding side.

7. The heat sinking pad of claim 3, wherein the heat sinking pad is provided with a plurality of sides, the edge of each side corresponding to at least one heat dissipation passage, and the heat dissipation passage extending from inside of the heat sinking pad to the edge of the corresponding side.

8. The heat sinking pad of claim 1, wherein the heat sinking pad is provided with a plurality of heat dissipation holes which are uniformly distributed in the heat sinking pad at positions corresponding to the solder loading area.

9. The heat sinking pad of claim 2, wherein the heat sinking pad is provided with a plurality of heat dissipation holes which are uniformly distributed in the heat sinking pad at positions corresponding to the solder loading area.

10. The heat sinking pad of claim 3, wherein the heat sinking pad is provided with a plurality of heat dissipation holes which are uniformly distributed in the heat sinking pad at positions corresponding to the solder loading area.

11. The heat sinking pad of claim 8, wherein the heat dissipation holes are semi-stop holes.

12. The heat sinking pad of claim 9, wherein the heat dissipation holes are semi-stop holes.

13. The heat sinking pad of claim 10, wherein the heat dissipation holes are semi-stop holes.

14. A printed circuit board on which a heat sinking pad is arranged, wherein the heat sinking pad is the heat sinking pad of claim 1.

15. The printed circuit board of claim 14, wherein the heat collection passages comprise a first heat collection passage which is in a shape of a closed ring.

16. The printed circuit board of claim 15, wherein the heat collection passages further comprise one or more second heat collection passages, each of which comprises a plurality of heat collection sections arranged in a ring shape, and each heat collection section being communicated with at least one of the heat dissipation passages.

17. The printed circuit board of claim 16, wherein the first heat collection passage is in a shape of a closed rectangular ring, and the plurality of heat collection sections comprised in each of the second heat collection passages are arranged in a shape of a rectangular ring.

18. The printed circuit board of claim 14, wherein the heat sinking pad is provided with a plurality of sides, the edge of each side corresponding to at least one heat dissipation passage, and the heat dissipation passage extending from inside of the heat sinking pad to the edge of the corresponding side.

19. The printed circuit board of claim 14, wherein the heat sinking pad is provided with a plurality of heat dissipation holes which are uniformly distributed in the heat sinking pad at positions corresponding to the solder loading area.

20. The printed circuit board of claim 19, wherein the heat dissipation holes are semi-stop holes.

* * * * *